United States Patent [19]
Klein et al.

[11] 4,170,017
[45] Oct. 2, 1979

[54] HIGHLY INTEGRATED SEMICONDUCTOR STRUCTURE PROVIDING A DIODE-RESISTOR CIRCUIT CONFIGURATION

[75] Inventors: Wilfried Klein, Holzgerlingen; Erich Klink, Schoenaich; Volker Rudolph, Aidlingen; Friedrich Wernicke, Schoenaich, all of Fed. Rep. of Germany

[73] Assignee: International Business Machines Corporation, Armonk, N.Y.

[21] Appl. No.: 889,169

[22] Filed: Mar. 23, 1978

[30] Foreign Application Priority Data

Jul. 26, 1977 [DE] Fed. Rep. of Germany ....... 2733615

[51] Int. Cl.² .................................... H01L 27/04
[52] U.S. Cl. ........................ 357/15; 357/46; 357/48; 357/51; 307/317 A
[58] Field of Search .............. 357/15, 48, 51, 86; 307/215, 317 A, 238

[56] References Cited

U.S. PATENT DOCUMENTS

| 3,631,309 | 12/1971 | Meyers | 357/48 |
| 3,631,311 | 12/1971 | Engbert | 357/48 |
| 3,693,057 | 9/1972 | Wiedmann | 357/48 |
| 3,909,837 | 9/1975 | Kronlage | 357/48 |
| 3,940,785 | 2/1976 | Genesi | 307/317 A |
| 3,971,060 | 7/1976 | Leuschner | 357/51 |
| 4,005,469 | 1/1977 | Chang et al. | 357/15 |

OTHER PUBLICATIONS

Wu, IBM Technical Disclosure Bulletin, vol. 11, No. 11, Apr. 1969, p. 1439.

Primary Examiner—William D. Larkins
Attorney, Agent, or Firm—Wesley DeBruin

[57] ABSTRACT

In an integrated circuit an improved highly integrated semiconductor structure for providing a Schottky diode-resistor circuit configuration is disclosed. Although not limited thereto, the improved highly integrated semiconductor structure has particular utility when employed in a monolithic memory.

6 Claims, 5 Drawing Figures

HIGHLY INTEGRATED SEMICONDUCTOR STRUCTURE PROVIDING A DIODE-RESISTOR CIRCUIT CONFIGURATION

FIELD OF THE INVENTION

The invention relates to a highly integrated semiconductor structure containing a Schottky diode-resistor circuit configuration which, although not limited thereto, can preferably be used as a decoupling diode having a high ohmic discharge resistor and co-acting with the selection lines of an integrated storage arrangement, a monolithic memory.

BACKGROUND AND DESCRIPTION OF THE PRIOR ART

In the development of highly integrated semiconductor circuits there are continuous efforts to design individual or several circuit elements with a miniumum of space, or surface area, on a semiconductor chip. Thereby a maximum number of circuit elements or functions can be provided on a single chip. As known in the art an increase in the degree of integration has a direct positive influence on cost, speed, power, reliability, etc. of the devices fabricated.

U.S. Pat. No. 3,631,311 discloses an integrated semiconductor circuit structure, which provides a transistor with a base leakage resistance directly integrated therewith. There, the resistance zone extends unilaterally into the surrounding isolation area, so that an external resistance contact is no longer required. In a similar configuration according to the publication in the IBM Technical Disclosure Bulletin, Vol. 11, No. 11, April 1969, page 1439, the discharge resistance integrated together with the transistor base is designed as a so-called pinch or dumbbell resistance. Such a pinch resistance is a twice-diffused resistance, where the conductive channel of the actual resistance area is pinched off in its crosssection by the introduction of a further doped area of the opposite conductivity type. Thus, relatively high ohmic resistance values may be obtained, without requiring a relatively sizeable amount of semiconductor surface as required when utilizing bulk resistance.

U.S. Pat. No. 4,005,469 discloses a relatively highly integrated combination of a transistor with an associated anti-saturation diode. An extended metal contact generates simultaneously on the semiconductor surface of one conductivity type an ohmic Schottky contact, and on the surrounding semiconductor surface of a second conductivity type a rectifying Schottkey contact.

SUMMARY OF THE INVENTION

The primary object of the invention is to provide an integrated semiconductor structure requiring a minimum of semiconductor surface for a Schottky diode-resistor circuit configuration, which operates with a minimum of external contact terminals and interconnects conductive lines. Further, the structure is readily fabricated by means of conventional, known, process steps. The resistor is to be designable for high values, as required for discharge resistors, and has minimum parasitic capacitance. The semi-conductor structure disclosed for achieving this object, in accordance with the invention, is summarized and characterized in its important features in the following paragraphs.

In summary, the invention provides an extremely merged integration of a Schottkey diode with a pinch resistor connected thereto, whose pinch-off doped area forms at the same time the cathode contact doped area of the Schottky diode. Additionally, the Schottky contact can be provided together with the resistor contact by a joint metal electrode overlapping the associated P/N junction. Finally, further contact for the resistor can be saved in that the resistor area is made to extend into the surrounding isolation area via which the respective voltage is supplied when the resistor is employed as a discharge resistor.

The diode resistor circuit configuration in accordance with the invention is characterized by an extremely low demand of active semiconductor surface since by means of avoiding an intermediate isolation it operates with a minimum of external contacts and interconnections. The high resistor value available having only a low parasitic capacitive influence permits a great variety of applications, e.g. as a decoupling diode-discharge resistor combination having a low power dissipation.

The foregoing and other objects and features of the invention, method and circuit, will be more apparent from the following more particular description of the preferred embodiments of the invention, as illustrated in the accompanying drawings.

The invention will be described in detail below by way of embodiments shown in the accompanying drawings.

BRIEF DESCRIPTION OF THE DRAWINGS

In the drawings.

FIG. 1 shows the electric diagram of the Schottky diode-resistor circuit configuration, which in accordance with the invention is provided in an improved highly integrated semiconductor structure. Diode D is a Schottky diode with anode contact A and cathode contact K. Connected to anode A is resistor R to whose other contact a reference voltage VR may be applied. When resistor R is used as a discharge resistor, VR may, for example, be the most negative voltage in the circuit. The symbol used for resistor R in FIG. 1 represents a pinch resistor (known per se) with a pinch zone within the resistor area.

FIG. 2A, in accordance with the invention, shows a particularly advantageous embodiment of a highly integrated semiconductor structure of the circuit of FIG. 1. FIG. 2B shows, as a supplement to FIG. 2A, a cross-section along the sectional line 2B of FIG. 2A. For further explaining the semiconductor structure, the cross-section of FIG. 2B has been extended to represent a perspective view. The Schottky diode-resistor circuit combination in accordance with the invention may be fabricated by conventional processes which are currently employed in the fabrication of integrated semiconductor circuits. Hence, no detailed discussion or description of the processes is deemed to be in order. The process may, for example, start from a P-conductive semiconductor substrate 1 consisting e.g. of monocrystalline silicon. In substrate 1 buried doped areas in the form of the known subcollector regions can be provided. For purposes of clarity, the buried subcollectors are not shown in the drawings. In bipolar semiconductor structures an epitaxial layer of the opposite conductivity type is in general subsequently applied on substrate 1 by means of known epitaxy processes. The epitaxial layer is subdivided by frame-like separating or isolating areas 2 into individual limited areas 3 of N-conductive semiconductor material. These limited areas 3 of the epitaxial layer are utilized in a known manner for providing the semiconductor elements to be produced therein.

Figure 1:
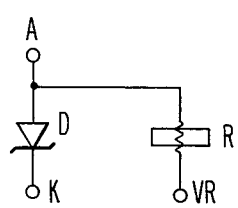
FIG. 1 shows the electric circuit diagram of the Schottky diode-resistor circuit combination.

In the illustrative embodiment, such a limited area 3 of N-conductive semiconductor material has integrated therein Schottky diode D as well as resistor R. Resistor R consists of the oblong P-conductive doped area 4 whose cross-section is pinched off, in the conventional pinch resistor manner, by introducing a further doped area 5 of the opposite conductivity type, namely the N+-conductive semiconductor material (5). Pinch-doped area 5 has a lesser junction depth than resistor area 4. In the transverse direction the pinch area 5 extends over the width of resistor area 4 (at 6), so that it is connected to the semiconductor material in area 3. The pinch area 5 is of the same conductivity type as the area 3, which surrounds resistor area 4. For providing doped areas 4 and 5 conventional doping processes such as diffusion, or ion implantation may be employed.

An external contact to resistor area 4 is provided at one end. In the embodiment of FIG. 2 the contact is metal electrode A at the righthand end. This metal electrode A forms an ohmic contact with the P-conductive resistor area 4. It is of particular advantage, and in accordance with the invention, to design metal electrode A as an extended contact. Thus it extends over resistor area 4 into the surrounding N-conductive material of epitaxial layer 3. Metal electrode A thus forms, apart from an ohmic contact on resistor area 4, a rectifying Schottky contact on the N-conductive semiconductor material of layer 3. The particular metal, or alloy, and semiconductor material required for obtaining the desired rectifying Schottky contact are well known in semiconductor technology. It is for example known that metal contacts of aluminum, platinum, etc. form a Schottky contact on slightly doped N-conductive silicon. The Schottky junction (at 7) is formed integrally with the ohmic contact on resistor area 4 by means of extended metal electrode A. The extended contact A, therefore forms, in addition to a contact to resistor area 4, the anode of Schottky diode D. This common contact is clearly depicted in the circuit diagram of FIG. 1. Instead of two contacts as conventionally required, only one single contact is now required. Thus a corresponding amount of active semiconductor surface is conserved.

In accordance with the invention on pinch-doped area 5 there is also a metal electrode K provided as an external contact. This metal electrode is marked K because the cathode of Schottky diode D is thereby externally accessible. According to the invention, use is made of the fact that apart from this function within the pinch resistor layout, pinch-doped area 5 represents at the same time the cathode contact doped area for the Schottky diode consisting of metal electrode A and the N-conductive semiconductor material of layer 3. This is accomplished by N+ area 5 which extends into the N-conductive semiconductor material of epitaxial layer 3 which surrounds resistor area 4. Metal-electrode K may consist of the same metal as metal electrode A because the degree of doping of pinch-doped area 5 is higher than that of the semiconductor material in area 3. Thus the metal electrode K forms an ohmic contact with area 5. Metal electrodes A and K may also be provided by means of conventional processes, e.g. by means of an aluminum vapor deposition, cathode sputtering, etc. It is to be appreciated that the process steps required to provide the doped areas as well as of the metallizations may be performed concurrently with like process steps required for other circuit elements to be fabricated on the same semiconductor chip. The P-conductive resistor area 4 may be provided simultaneously with base doping. The pinch-doped area 5 together with the emitter doping. The metal contacts A and K together with the remaining metallizations for the contacts and conductive lines on the chip.

Figure 2A:
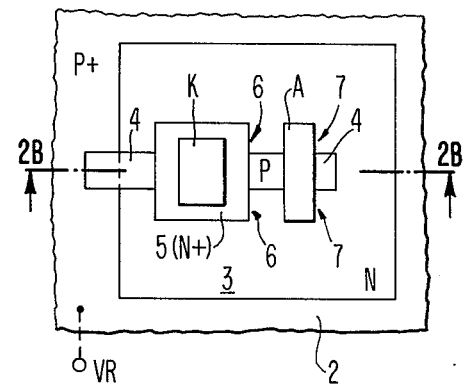
FIG. 2A shows a plan view of a preferred embodiment of the highly integrated semiconductor structure in accordance with the invention.
Figure 2B:
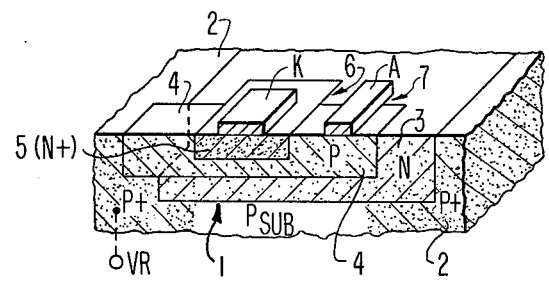
FIG. 2B shows a perspective cross-sectional view of the semiconductor structure of FIG. 1.

The above described semiconductor structure, referring to the circuit diagram of FIG. 1, provides the Schottky diode D with its external contacts A and K as well as resistor R connected to anode A. If resistor R is used as a discharge resistor to the most negative potential of the circuit it is, in accordance with the invention, desirable to eliminate the requirement of a second metal contact to resistor 4. The otherwise required second metal contact to resistor area 4 is provided by extending resistor area 4 into isolation zone 2 surrounding semiconductor area 3. To provide reversed biased P/N junctions isolation areas 2 are generally at the lowest potential available in the circuit. Thus the extremity of resistor R (area 4) contacting isolation zone 2 receives at its contact therewith reference potential VR. The afore-recited interconnection of isolation area 2 and resistor area 4, obviates the necessity of providing a specific additional contact requiring a sizeable amount of semiconductor surface area. This has the advantage, that owing to the interconnection of isolation areas 2 only one, or at any rate only a few, contacts on the entire chip for the potential VR are required.

It will now be fully apparent that the Schottky diode-resistor circuit combination shown in FIG. 1 may be realized with an extremely high integtration density and only two external contacts required. Comparing the semiconductor structure in accordance with the invention with a conventional (prior art) semiconductor structure of such a circuit clearly shows a considerable amount of semiconductor surface area saved. This will be more readily apparent by means of a true-to-scale surface area comparison of the structure shown in FIG. 3 (prior art) to that of FIGS. 2A and 2B.

Figure 3:
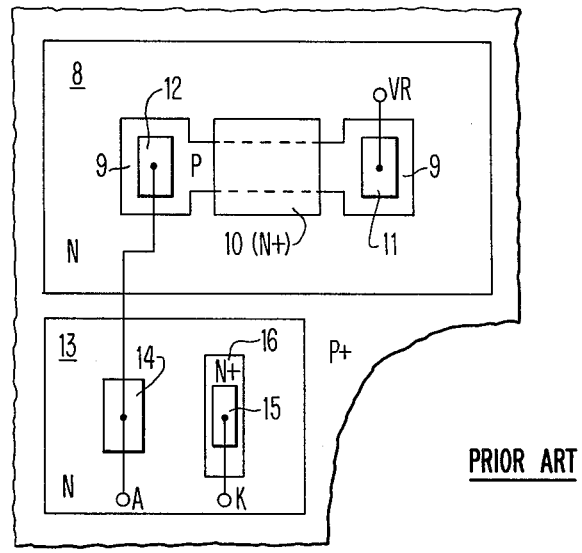
FIG. 3 shows a plan view of a conventional (prior art) integrated Schottky diode-resistor circuit configuration.

FIG. 3 shows a conventional (prior art) integrated semiconductor structure for the circuit configuration of FIG. 1. The same design rules, i.e. spacing values, minimum area dimensions, etc., as in the embodiment in accordance with invention, FIG. 2A, have been used. In FIG. 3, the pinch resistor with its P-conductive resistor area 9 and the pinch-doped area 10, as well as the two external contacts 11 and 12 are shown in a first isolated semiconductor area 8. Isolated therefrom, the Scottky diode is provided in a second semiconductor area 13 of N-conductive semiconductor material. There, metal electrode 14 forms the Schottky junction for the anode, whereas the other metal electrode 15 forms on the N+-conductive doped area 16 an ohmic contact for the cathode of the Schottky diode. A semiconductor surface area comparison of the conventional (prior art) structure of FIG. 3 with the structure in accordance with a preferred embodiment of the invention, FIG. 2A, results in a surface area saving in the order of 54%.

Figure 4:
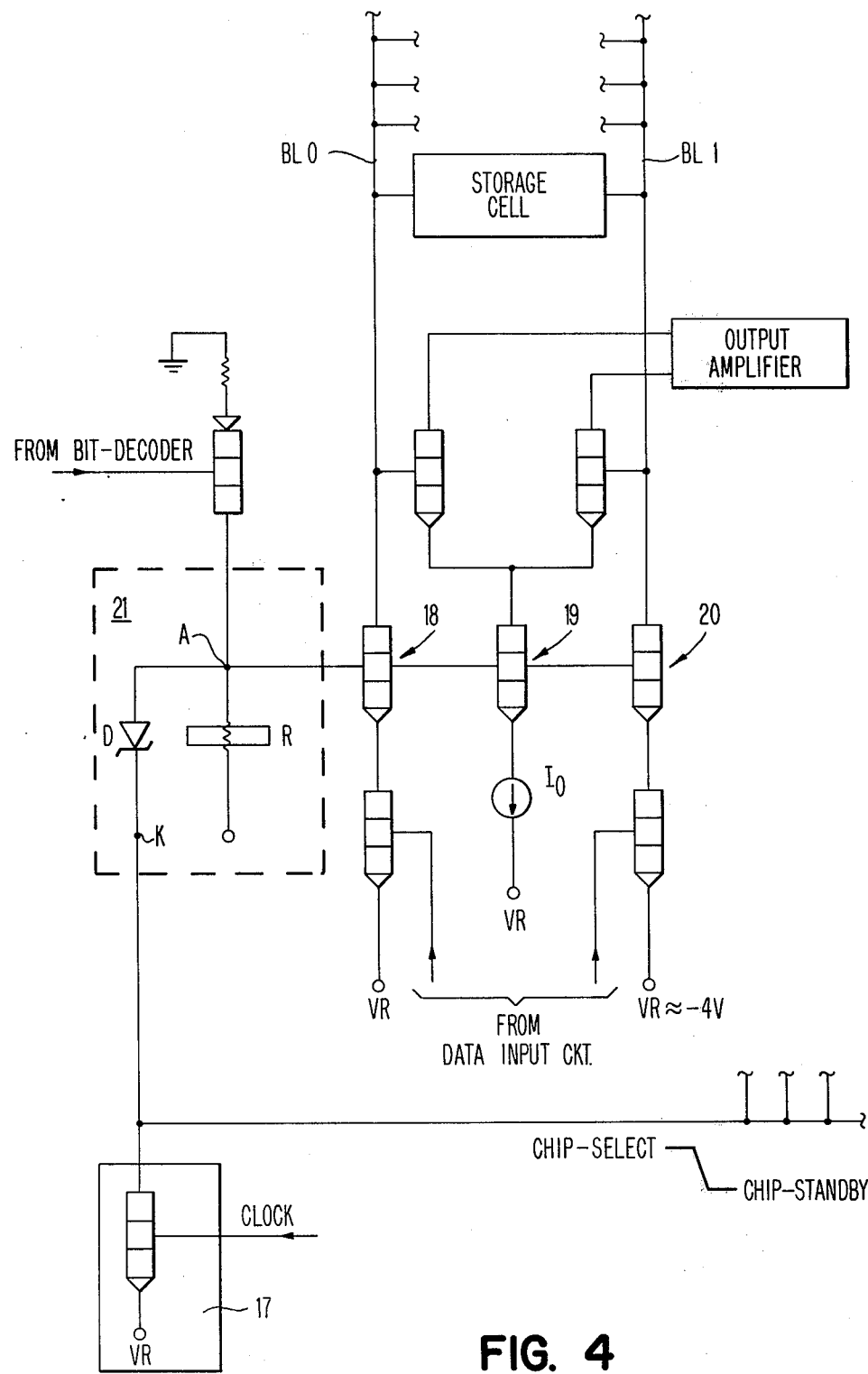
FIG. 4 shows the electric circuit diagram of storage (monolithic memory) accessing circuitry for explaining one of the advantageous uses of the structure and circuitry in accordance with the invention.

With such an advantageous integrated semiconductor structure, from the point of view of semiconductor surface area requirement, the expert designer of integrated circuits has a circuit structure at his disposal which he can advantageously use in connection with a great variety of circuits. FIG. 4 shows as an application example, for the use of the Schottky diode-resistor circuit configuration, in accordance with the invention, in the accessing circuit portion of a semiconductor store. FIG. 4 shows a portion of a semiconductor, or monolithic memory including a pair of bit lines BL0, BL1. For purposes of explanation of the subject invention, the store circuit portions are drawn only schematically, e.g. the storage cells, output amplifiers etc. In order to achieve in such a semiconductor store, short cycle times with low power consumption, all word and bit selection lines have to be charged or brought, respectively, after each access period, to defined dc potentials for the standby state by means of clocked control logic. For this purpose, a series of transistors are provided as current sinks and current sources which are controlled by a schematically shown circuit 17. If there is no selection, the base contacts of transistors 18, 19 and 20 can be pulled down via circuit 17 to the reference potential VR, e.g. the lowest potential available in the circuit. The voltage drop over the discharge Schottky diode D is in that case assumed to be unimportant. Each such group of transistors belonging to a bit line pair, or to a word line, can be decoupled according to FIG. 1 from the respective transistors of another bit line pair, or of another word line, by the Schottky diode-resistor circuit configuration shown in the framed area 21. When there is a chip selection signal all decoupling Schottky diodes D on the respective chip are reverse biased so that for the storage cells on the chip write-in, or read-out, cycles can be performed. In order to ensure the reverse-biased decoupling Schottky diodes D of the transistors (corresponding to 18, 19 and 20) belonging to nonselected address lines cannot accidentally be switched on by means of a potential rise at point A due to leakage currents, a discharge resistor R is additionally provided in parallel to the anode contact of decoupling Schottky diode D. In order to ensure, however, that there is only a minimum current flow through the discharge resistor during selection, said discharge resistor R should have a maximum value as well as a minimum capacitance, for these characteristics have a direct influence on the switching times and the power dissipated.

It is to be appreciated that in an integrated semiconductor store (monolithic memory) a decoupling Schottky diode-resistor circuit configuration must be realized on a mimimum of semiconductor surface area in order to avoid a reduction in the number of storage cells provided on the chip. As shown above, this very highly integrated semiconductor circuit configuration is readily provided by the invention.

While the invention has been particularly shown and described with reference to the preferred embodiments thereof, it will be understood by those skilled in the art that various changes in form and details may be made therein without departing from the spirit and scope of the invention.

What is claimed is:

1. In an integrated circuit contained on a semiconductor chip having at least one substantially planar surface said semiconductor chip having
    a first region of a first conductivity type;
    a second region of a second conductivity type contained as a pocket within said first region;
    a third region of said first conductivity type, said third region having a first portion extending into said first region and a second portion extending into said second region;
    a fourth region of a said second conductivity type, said fourth region having a first portion extending into said second region and a second portion extending into said third region;
    a first metal contact providing an ohmic electrical connection to said third region and a Schottky barrier junction to said second region; and
    a second metal contact for providing an electrical connection to said fourth region.

2. In an integrated circuit contained on a semi-conductor chip as recited in claim 1, wherein said first region is of P+ conductivity, said second region is of N conductivity, said third region is of P conductivity, and said fourth region of N+ conductivity.

3. In an integrated circuit contained on a semiconductor chip as recited in claim 2, wherein said second metal contact provides an ohmic contact to said fourth region, whereby said first metal contact provides the anode of a Schottky diode and said second metal contact provides the cathode of said Schottky diode.

4. In an integrated circuit contained on a semiconductor chip as recited in claim 3, wherein said third region is a pinch-resistor connected between said first metal contact and said first region, where said first metal contact provides a Schottky barrier junction connection to said second region and an ohmic connection to said pinch resistor.

5. In an integrated circuit contained on a semiconductor chip said semiconductor chip having
    a first region of a first conductivity type;
    a second region of a second conductivity type, said second region being contained as a pocket within said first region;
    a third region of said first conductivity type, said third region extending from said first region through a portion of said second region;
    a fourth region of said second conductivity type contained within said second region and bridging at least a portion of said third region;
    a first metal contact, said first metal contact having first and second integral portions, said first portion of said first metal contact physically contacting at least an area of said third region and said second portion of said first metal contact physically contacting at least an area of said second region;
    a second metal contact, said second metal contact physically contacting at least an area of said fourth region, whereby said first metal contact provides a Schottky barrier junction with said area on said second region and an ohmic connection to said area of said third region, said second metal contact provides an ohmic connection to said fourth region, where said third region is a pinch resistor connected between said first metal contact and said first region, said first metal contact also provides a connection to the anode of a Schottky barrier diode whose barrier junction is provided also by said first metal contact and whose anode connection is provided by said first metal contact.

6. In an integrated circuit contained on a semiconductor chip as recited in claim 15, wherein said first region is P+ conductivity, said second region is N conductivity, said third region is P conductivity, and said fourth region is N+ conductivity.

* * * * *

UNITED STATES PATENT AND TRADEMARK OFFICE
CERTIFICATE OF CORRECTION

PATENT NO. : 4,170,017
DATED : October 2, 1979
INVENTOR(S) : Wilfried Klein et al.

It is certified that error appears in the above—identified patent and that said Letters Patent are hereby corrected as shown below:

Column 8, line 1      "claim 15," should read --claim 5,--.

Signed and Sealed this

Thirteenth Day of January 1981

[SEAL]

Attest:

SIDNEY A. DIAMOND

Attesting Officer     Commissioner of Patents and Trademarks